US012795875B2

(12) United States Patent
Jung et al.

(10) Patent No.: US 12,795,875 B2

(45) Date of Patent: Nov. 10, 2026

(54) ELECTRONIC DEVICE INCLUDING SHIELDING STRUCTURE FOR REDUCING MOUNTING VOLUME OF COMPONENT

(71) Applicant: SAMSUNG ELECTRONICS CO., LTD., Suwon-si (KR)

(72) Inventors: Kwangho Jung, Suwon-si (KR); Yongwon Lee, Suwon-si (KR); Jaeheung Ye, Suwon-si (KR); Jinhwan Jeon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 239 days.

(21) Appl. No.: 18/666,570

(22) Filed: May 16, 2024

(65) Prior Publication Data

US 2024/0306354 A1 Sep. 12, 2024

Related U.S. Application Data

(63) Continuation of application No. PCT/KR2022/018115, filed on Nov. 16, 2022.

(30) Foreign Application Priority Data

Dec. 24, 2021 (KR) ........................ 10-2021-0187358
Mar. 2, 2022 (KR) ........................ 10-2022-0027069

(51) Int. Cl.

| | |
|---|---|
| ***H05K 1/18*** | (2026.01) |
| ***H05K 1/02*** | (2006.01) |
| ***H05K 9/00*** | (2006.01) |

(52) U.S. Cl.

CPC ......... *H05K 9/0024* (2013.01); *H05K 1/0218* (2013.01); *H05K 1/18* (2013.01);

(Continued)

(58) Field of Classification Search

CPC ...... H05K 9/0024; H05K 1/0218; H05K 1/18; H05K 2201/10189; H05K 2201/10242

(Continued)

(56) References Cited

U.S. PATENT DOCUMENTS 5,639,989 A * 6/1997 Higgins, III ........... H05K 3/284 174/394
8,115,117 B2 2/2012 Kapusta et al.

(Continued)

FOREIGN PATENT DOCUMENTS

EP 3420786 B1 12/2020
JP 6-53686 A 2/1994

(Continued)

OTHER PUBLICATIONS

Office Action dated Aug. 26, 2025, issued by Korean Patent Office in Korean Patent Application No. 10-2022-0027069.

(Continued)

*Primary Examiner* — Binh B Tran

(74) *Attorney, Agent, or Firm* — Sughrue Mion, PLLC

(57) ABSTRACT

An electronic device according to an embodiment includes a printed circuit board including a conductive layer and a conductive pad connected to the conductive layer and exposed to an outside of the printed circuit board; an electric component disposed on a first region of the printed circuit board and the electric component electrically connected to the printed circuit board; a conductive member disposed on the conductive pad and the conductive member surrounding at least part of a periphery of the first region of the printed circuit board; and a shielding member isolating the first region of the printed circuit board from the outside of the printed circuit board by covering the electric component and (Continued)

the conductive member, the shielding member electrically connected to the conductive layer. In addition, various embodiments are possible.

20 Claims, 13 Drawing Sheets

(52) U.S. Cl.
CPC .............. *H05K 2201/10189* (2013.01); *H05K 2201/10242* (2013.01)

(58) Field of Classification Search
USPC .......................................................... 361/748
See application file for complete search history.

(56) References Cited

U.S. PATENT DOCUMENTS

| | | | | |
|---|---|---|---|---|
| 8,493,749 | B2 | 7/2013 | Myers et al. | |
| 8,691,393 | B2 | 4/2014 | Cook et al. | |
| 8,853,562 | B2 | 10/2014 | Izawa et al. | |
| 9,179,538 | B2 | 11/2015 | Foster et al. | |
| 10,431,887 | B2 | 10/2019 | Kim et al. | |
| 11,553,629 | B2 | 1/2023 | Lee et al. | |
| 12,016,112 | B2 * | 6/2024 | Otsubo ................ | H05K 1/0218 |
| 2014/0071634 | A1 | 3/2014 | Pakula et al. | |
| 2016/0242331 | A1 | 8/2016 | Park et al. | |
| 2017/0251576 | A1 * | 8/2017 | Jeong ................... | H05K 9/0024 |
| 2017/0318713 | A1 | 11/2017 | Bang et al. | |
| 2018/0092257 | A1 | 3/2018 | Otsubo et al. | |
| 2018/0116078 | A1 | 4/2018 | Mun et al. | |
| 2019/0166731 | A1 | 5/2019 | Kuk et al. | |

FOREIGN PATENT DOCUMENTS

| | | | |
|---|---|---|---|
| JP | 2004-71629 | A | 3/2004 |
| JP | 2007-48843 | A | 2/2007 |
| JP | 2010-80854 | A | 4/2010 |
| JP | 2011-18873 | A | 1/2011 |
| JP | 2021-61412 | A | 4/2021 |
| KR | 10-2006-0093519 | A | 8/2006 |
| KR | 10-2015-0071149 | A | 6/2015 |
| KR | 10-2017-0123747 | A | 11/2017 |
| KR | 10-2017-0125690 | A | 11/2017 |
| KR | 10-2018-0051173 | A | 5/2018 |
| KR | 10-1847348 | B1 | 5/2018 |

OTHER PUBLICATIONS

International Search Report (PCT/ISA/210) issued by the International Searching Authority on Mar. 2, 2023 in corresponding International Application No. PCT/KR2022/018115.
Written Opinion (PCT/ISA/237) issued by the International Searching Authority on Mar. 2, 2023 in corresponding International Application No. PCT/KR2022/018115.
Extended European Search Report dated Jul. 22, 2024, issued by the European Patent Office in European Application No. 22818170.7.
Communication dated May 27, 2026, issued by Korean Ministry of Intellectual Property in Korean Patent Application No. 10-2022-0027069.
Communication issued Jun. 9, 2026 by the European Patent Office in European Patent Application No. 22818170.7.

* cited by examiner

ELECTRONIC DEVICE INCLUDING SHIELDING STRUCTURE FOR REDUCING MOUNTING VOLUME OF COMPONENT

CROSS-REFERENCE TO RELATED APPLICATION(S)

This application is a continuation application, claiming priority under § 365(c), of International Application No. PCT/KR2022/018115, filed on Nov. 16, 2022, which is based on and claims the benefit of Korean Patent Application No. 10-2021-0187358 filed on Dec. 24, 2021, and Korean Patent Application No. 10-2022-0027069 filed on Mar. 2, 2022, and all the benefits accruing therefrom under 35 U.S.C. § 119, the disclosures of which are incorporated by reference herein in their entireties.

TECHNICAL FIELD

Various embodiments relate to an electronic device including a shielding structure for reducing a mounting volume of a component.

BACKGROUND

As a user request various functions, an electronic device may comprise electronic components that perform different functions. The electronic components may be mounted in the electronic device while being disposed on a printed circuit board. For example, the electronic components performing different functions may be mounted in the electronic device by being disposed on the one printed circuit board in the electronic device or on each of the different printed circuit boards.

In order for the user to carry the electronic device, the electronic device may be miniaturized. As the electronic device is miniaturized, a mounting space in the electronic device for mounting various electronic components may become insufficient.

SUMMARY

As an electronic device is miniaturized, electronic components in an electronic device may be disposed adjacent to each other. When the electronic components are disposed adjacent to each other, electromagnetic waves emitted from some electronic components may affect the operation of some other electronic components. In order to minimize the influence that the electronic component receives from electromagnetic waves, the electronic device may comprise a shielding structure for shielding electromagnetic waves. When the electronic device comprises the shielding structure, a space for mounting other electronic components in the electronic device may become insufficient due to the shielding structure. The electronic device may need a shielding structure that shields electromagnetic waves so that the electronic components do not affect each other while securing a mounting space for mounting various electronic components.

Various embodiments relate to an electronic device including a shielding structure for reducing a mounting volume of a component.

The technical problems to be achieved in this document are not limited to those described above, and other technical problems not mentioned herein will be clearly understood by those having ordinary knowledge in the art to which the present disclosure belongs, from the following description.

An electronic device according to an embodiment may comprise a printed circuit board including a conductive layer and a conductive pad connected to the conductive layer and exposed to an outside of the printed circuit board an electric component disposed on a first region of the printed circuit board and the electric component electrically connected to the printed circuit board; a conductive member disposed on the conductive pad and the conductive member surrounding at least part of a periphery of the first region of the printed circuit board; and a shielding member isolating the first region of the printed circuit board from the outside of the printed circuit board by covering the electric component and the conductive member, the shielding member electrically connected to the conductive layer. In addition, various embodiments may be possible.

According to an embodiment, an electronic device may comprise a printed circuit board including an one surface, a side surface facing in a direction perpendicular to a direction in which the one surface faces, and a conductive layer partially exposed through the side surface; an electric component electrically connected to the printed circuit board and the electric component disposed on the one surface of the printed circuit board; and a shielding member isolating the one surface of the printed circuit board from an outside of the printed circuit board by covering the electric component and the side surface of the printed circuit board, and the shielding member electrically connected to the conductive layer.

According to an embodiment, an electronic device can shield electromagnetic waves transmitted from other electronic components to the electronic components and secure a mounting space by electrically isolating one region in which the electronic components are disposed through the shielding member and the conductive member from the outside of the printed circuit board. The electronic device according to an embodiment can mount various electronic components in the secured mounting space, and can provide various user experiences to a user.

The effects that can be obtained from the present disclosure are not limited to those described above, and any other effects not mentioned herein will be clearly understood by those having ordinary knowledge in the art to which the present disclosure belongs, from the following description.

DETAILED DESCRIPTION

Figure 1:
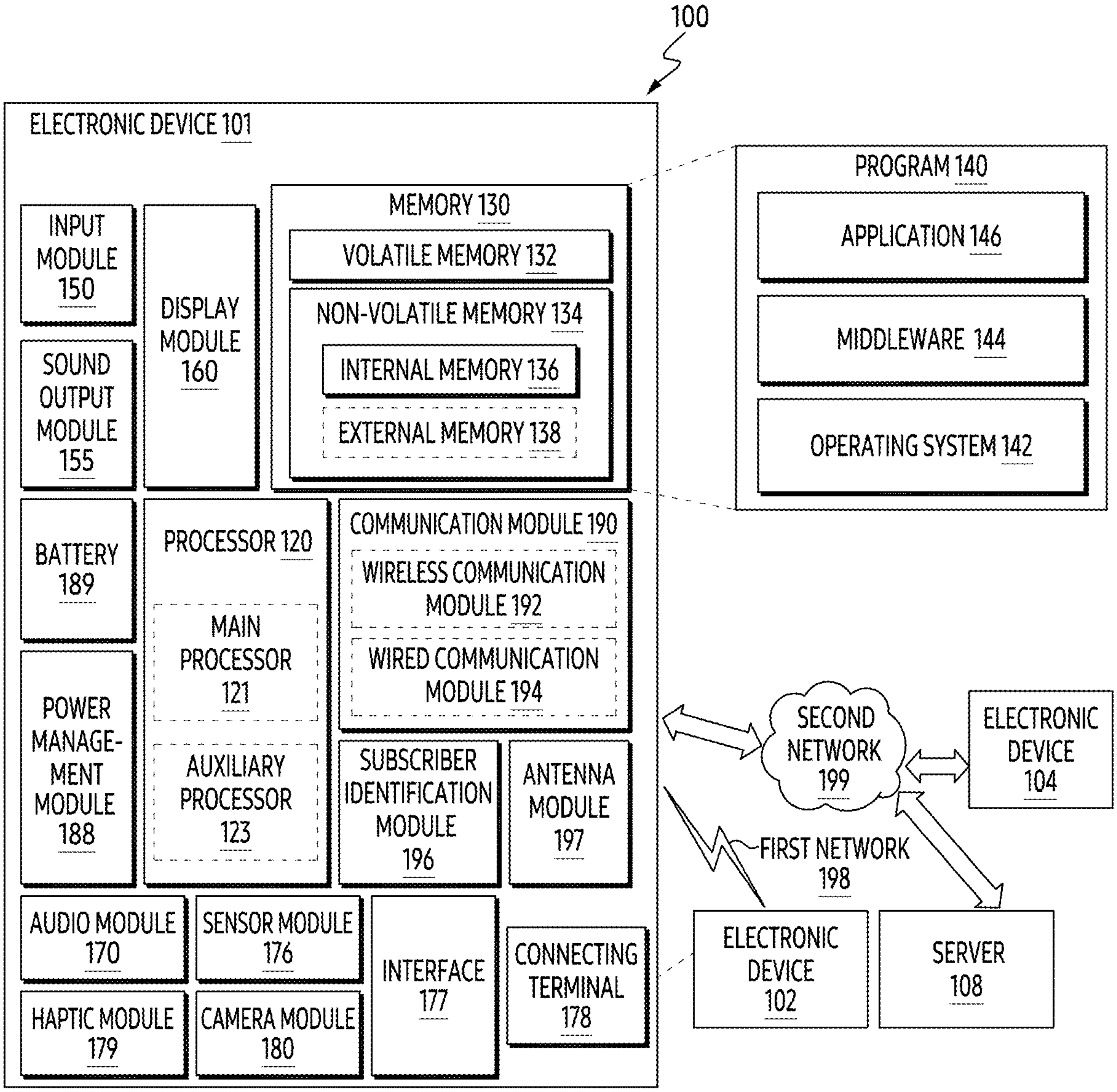
FIG. 1 is a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mm Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
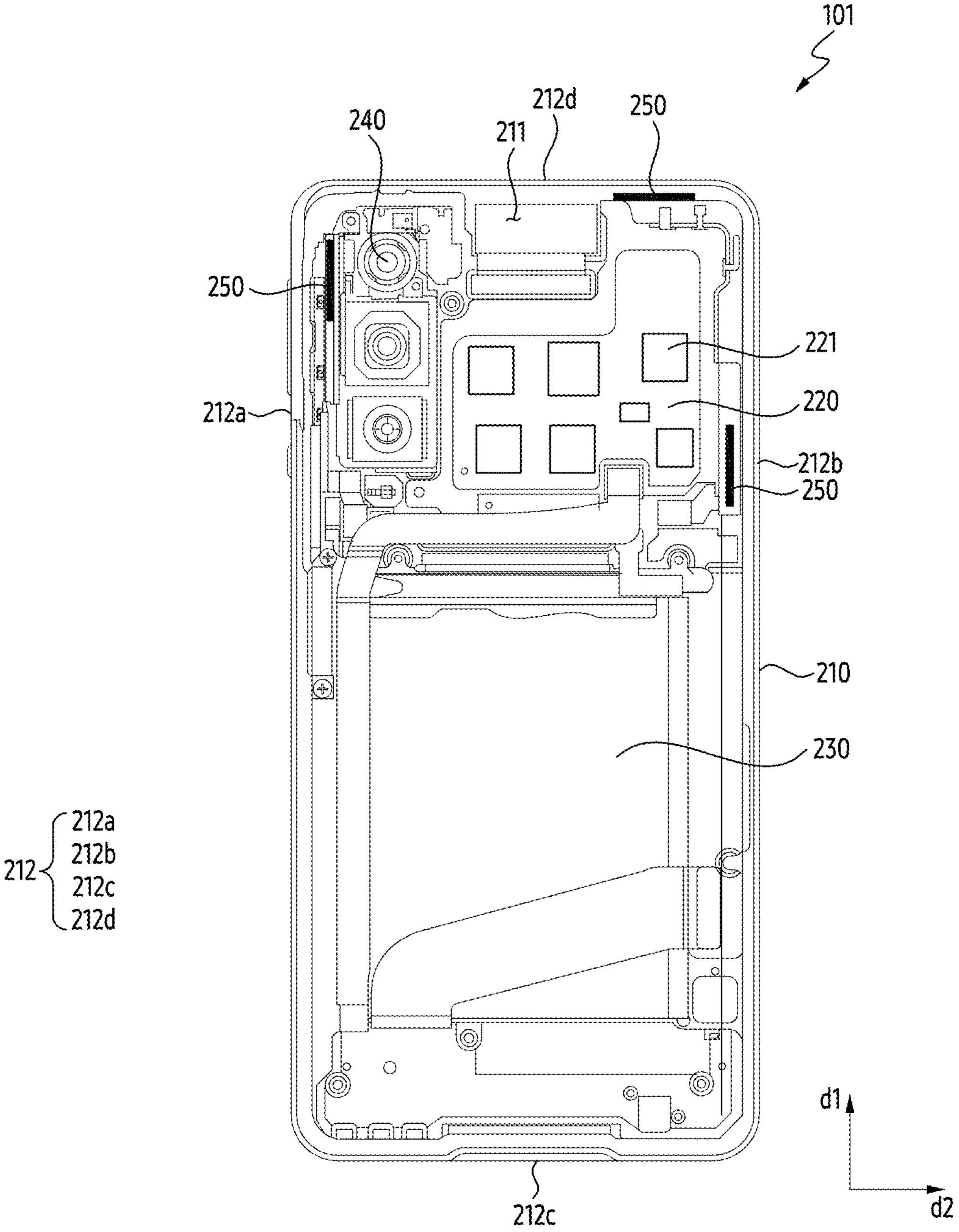
FIG. 2 illustrates an example of an internal structure of an electronic device, according to an embodiment.

FIG. 2 illustrates an example of an internal structure of an electronic device, according to an embodiment.

Referring to FIG. 2, the electronic device 101 according to an embodiment may comprise a housing 210, a printed circuit board 220, a battery 230, a camera module 240, and an antenna 250. Since the battery 230 and the camera module 240 of FIG. 2 may be substantially the same as the battery 189 and the camera module 180 of FIG. 1, respectively, overlapping descriptions will be omitted.

According to an embodiment, the housing 210 may form an overall exterior of the electronic device 101. The housing 210 may be in contact with the user's hand when the user grips the electronic device 101. According to an embodiment, the housing 210 may form an internal space in which various components of the electronic device 101 are disposed. According to an embodiment, the housing 210 may comprise a first surface (not illustrated) on which a display (e.g., a display module 160 of FIG. 1) is disposed, a second surface 211 facing the first surface, and a side surface 212 formed along at least a part of periphery of the first surface and second surface 211. According to an embodiment, the first surface and the second surface 211 may be spaced apart from each other while facing each other, and the side surface 212 may form an internal space of the housing 210 by extending along at least a part of the periphery of the first surface and the second surface 211 between the first surface and the second surface 211.

According to an embodiment, the side surface 212 may comprise a first side surface 212*a* extending in a first direction d1, a second side surface 212*b* spaced apart from the first side surface 212*a* and extending in the first direction d1 to be substantially parallel to the first side surface 212*a*, a third side surface 212*c* extending from one end of the first side surface 212*a* to one end of the second side surface 212*b* along a second direction d2 substantially perpendicular to the first direction, and a fourth side surface 212*d* extending from the other end of the first side surface 212*a* to the other end of the second side surface 212*b* along the second direction d2. For example, the first side surface 212*a* and the second side surface 212*b* may extend longer than the third side surface 212*c* and the fourth side surface 212*d* so that the electronic device 101 has a length. According to an embodiment, the first side surface 212*a*, the second side surface 212*b*, the third side surface 212*c*, and the fourth side surface 212*d* together with the first surface and the second surface 211 may form an internal space in which the components of the electronic device 101 are mounted.

According to an embodiment, the printed circuit board 220 may form an electrical connection between the electronic components 221 of the electronic device 101 that performs the overall operation of the electronic device 101. The electronic components 221 may be disposed on the printed circuit board 220 by soldering, for example, but are not limited thereto. According to an embodiment, the printed circuit board 220 may be a main circuit board of the electronic device 101 on which a processor (e.g., a processor 120 of FIG. 1) is disposed. According to an embodiment, the printed circuit board 220 may form an electrical connection between the electronic components 221 disposed on the printed circuit board 220 and various components of the electronic device 101 disposed outside the printed circuit board 220 through a connection member. For example, the connection member may comprise at least one of a coaxial cable connector, a board to board connector, an interposer, or a flexible printed circuit board (FPCB). According to an embodiment, the printed circuit board 220 may extend from the second side surface 212*b* in a direction opposite to the second direction d2 among the side surfaces 212*a*, 212*b*, 212*c*, and 212*d* of the housing 210 and may be spaced apart from the first side surface 212*a*.

According to an embodiment, the printed circuit board 220 may mean at least one selected from a printed circuit board having rigidity, a flexible printed circuit board having flexibility, an interposer, or a combination thereof. For example, the printed circuit board 220 may comprise a structure in which a flexible printed circuit board is connected to a printed circuit board having rigidity, or a structure in which a plurality of printed circuit board having rigidity are connected by an interposer, but is not limited thereto, and the structure of the printed circuit board 220 may be variously changed according to the internal structure of the electronic device 101.

According to an embodiment, the electronic components 221 may be configured to perform a pre-designed function of the electronic device 101. The electronic components 221 may comprise at least one of an active element (e.g., a transistor) configured to change a received signal based on receiving an electrical signal, or a passive element configured not to deform the received electrical signal (e.g., a resistor, an inductor, or a capacitor). For example, at least some of the electronic components 221 may be an integrated circuit (IC) in which a plurality of devices are integrated, but is not limited thereto.

According to an embodiment, the battery 230 may store power that may be supplied to various components of the electronic device 101. According to an embodiment, the battery 230 may be electrically connected to the printed circuit board 220 to supply power to the electronic components 221 on the printed circuit board 220. According to an embodiment, the battery 230 may occupy most of the internal space of the housing 210 so that the electronic device 101 provides a user with various functions.

The camera module 240 may obtain (or generate) a still image and a moving image based on receiving light transmitted from the outside of the electronic device 101. According to an embodiment, the camera module 240 may be disposed at a periphery of the housing 210 to be mounted in a limited mounting space of the housing 210. For example, the camera module 240 may be mounted in an internal space of the housing 210 positioned between the first side surface 212*a* and the printed circuit board 220.

According to an embodiment, the antenna 250 may transmit a signal to the outside of the electronic device 101 or may receive a signal from the outside of the electronic device 101. The antenna 250 may compose the antenna module (e.g., the antenna module 197 of FIG. 1) described above. According to an embodiment, the antenna 250 may comprise a plurality of antenna elements disposed to form a directional beam. For example, the plurality of antenna elements may comprise a plurality of antenna arrays (e.g., a dipole antenna array and/or a patch antenna array) of the same or different shapes and types. The plurality of antenna elements may increase coverage of a signal radiated from the antenna 250 by being disposed at different positions.

According to an embodiment, the antenna 250 may be disposed at a periphery of the housing 210 to transmit or receive a signal to or from the outside of the electronic device 101 through at least a part of the side surface 212. For example, the antenna 250 may be disposed in the internal space of the electronic device 101 to be adjacent to at least one of the first side 212*a*, the second side 212*b*, and the fourth side 212*d*.

According to an embodiment, as various components (e.g., the battery 230, the camera module 240, or the antenna 250) are mounted on the electronic device 101, the printed circuit board 220 may be disposed adjacent to various components of the electronic device 101. When the printed circuit board 220 is disposed adjacent to various components of the electronic device 101, electromagnetic waves emitted as various components of the electronic device 101 operate are transmitted to the electronic components 221, and the electronic components 221 may cause a malfunction. For example, the electronic components 221 may cause a malfunction by electromagnetic waves emitted from the antenna 250, may cause a malfunction by electromagnetic waves emitted from some of the electronic components 221 disposed on the printed circuit board 220, or may cause a malfunction by electromagnetic waves emitted from the camera module 240. When a shield can is disposed inside the housing 210 to shield the electronic components 221, a mounting space inside the housing 210 is wasted due to the volume of the shield can, and thus the electronic device 101 may not be able to mount various components. Hereinafter, a shielding structure capable of electrically shielding the electronic components 221 while securing a mounting space inside the electronic device 101 will be described.

Figure 3:
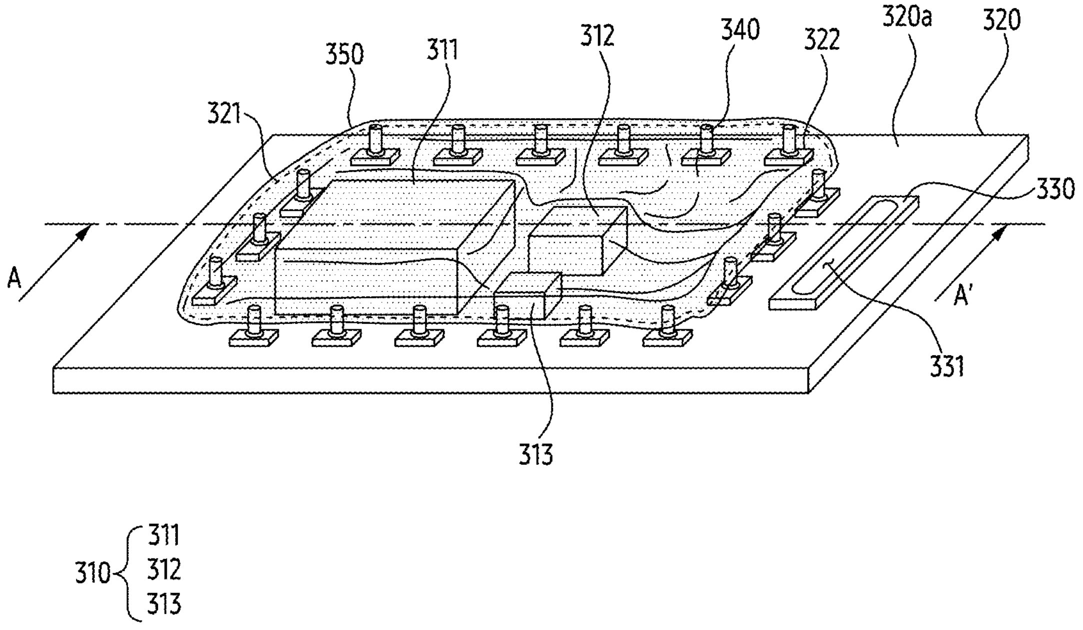
FIG. 3 is a perspective view of a printed circuit board of an electronic device, according to an embodiment.

FIG. 3 is a perspective view of a printed circuit board of an electronic device, according to an embodiment.

Referring to FIG. 3, the electronic device (e.g., the electronic device 101 of FIG. 1 and/or the electronic device 101 of FIG. 2) according to an embodiment may comprise at least one electronic component 310, a printed circuit board 320, a connector 330, a conductive member 340, and a shielding member 350. Since the electronic component 310 and the printed circuit board 320 of FIG. 3 may be substantially the same as the electronic components 221 and the printed circuit board 220 of FIG. 2, respectively, overlapping descriptions will be omitted.

According to an embodiment, the electronic component 310 is electrically connected to the printed circuit board 320. For example, the electronic component 310 may be electrically connected to a ground line and/or a signal line of the printed circuit board 320. According to an embodiment, the electronic component 310 may be disposed on one surface 320*a* of the printed circuit board 320. For example, the electronic component 310 may be disposed directly on the one surface 320*a* of the printed circuit board 320. The electronic component 310 may protrude from one surface 320*a* of the printed circuit board 320 to have a height. According to an embodiment, the electronic component 310 may comprise a plurality of electronic components 311, 312, and 313 spaced apart from each other on the printed circuit board 320. For example, the plurality of electronic components 311, 312, and 313 may be spaced apart from each other in the first region 321 on one surface 320*a* of the printed circuit board 320.

According to an embodiment, the printed circuit board 320 may comprise conductive layers forming a ground line and/or a signal line. The ground line may be a line extending to the grounding portion of the printed circuit board 320 or may form a ground of the printed circuit board 320, and the signal line may form an electrical circuit between the electronic components 310 inside the printed circuit board 320. According to an embodiment, the printed circuit board 320 comprises a conductive pad 322, wherein the conductive pad 322 may be electrically connected to the ground line. The conductive pad 322 may be exposed to the outside of the printed circuit board 320 through one surface 320*a* of the printed circuit board 320. For example, the conductive pad 322 may be a plating layer formed on a part of the conductive layer that forms a ground line and is exposed to the outside of the printed circuit board 320. For another example, the conductive pad 322 may be formed by protruding a part of a conductive layer forming the ground line of the printed circuit board 320 to the outside of the printed circuit board 320.

According to an embodiment, the conductive pad 322 may be spaced apart from the electronic component 310 and may surround at least a part of a periphery of the first region 321 on which the electronic component 310 is disposed. The conductive pad 322 may comprise a plurality of conductive pads 322 that surround at least a part of a periphery of the first region 321 and are disposed spaced apart from each other. For example, the plurality of conductive pads 322 may form an open curve by surrounding only a part of the periphery of the first region 321. For another example, the plurality of conductive pads 322 may form a closed curve by surrounding the entire periphery of the first region 321 and may divide the first region 321 of the printed circuit board 320 and another region of the printed circuit board 320.

The connector 330 may electrically connect the printed circuit board 320 to another printed circuit board in electronic device 101. For example, the connector 330 may directly electrically connect the printed circuit board 320 to another printed circuit board in electronic device 101. According to an embodiment, the connector 330 may be disposed outside the first region 321 of the printed circuit board 320 on which the electronic component 310 is disposed. According to an embodiment, the connector 330 may be detachably coupled to another connector disposed on another printed circuit board. The connector 330 may comprise an accommodating groove 331 capable of accommodating another connector. When another connector is accommodated in the accommodating groove 331 of the connector 330, the printed circuit board 320 may be electrically connected to another printed circuit board. For example, the connector 330 may be a socket connector or a plug connector among board-to-board connectors.

The conductive member 340 may be electrically connected to the ground line of the printed circuit board 320 through the conductive pad 322. According to an embodiment, the conductive member 340 surrounds at least a part of a periphery of the first region 321. The conductive member 340 may comprise a plurality of conductive members 340 surrounding at least a part of a periphery of the first region 321 and spaced apart from each other. For example, the plurality of conductive members 340 may form an open curve by surrounding only a part of a periphery of the first region 321. For another example, the plurality of conductive members 340 may form a closed curve by surrounding the entire periphery of the first region 321. According to an embodiment, the conductive member 340 may comprise a conductive material to be electrically connected to the ground line of the printed circuit board 320. For example, the conductive member 340 may comprise German silver, nickel-plated stainless steel, nickel-plated copper alloy, or a clad metal including German silver and stainless steel as a material, but is not limited thereto, and may comprise a metal that may be soldered on the conductive pad 322 as a material.

According to an embodiment, the conductive member 340 is disposed on the conductive pad 322. For example, when there are a plurality of conductive pads 322, the conductive member 340 may have a number corresponding to the number of a plurality of conductive pads 322, and the conductive members 340 may be disposed in each of the plurality of conductive pads 322. For another example, when there are a plurality of conductive pads 322, the conductive members 340 may have a number corresponding to only some of the conductive pads 322 of the plurality of conductive pads 322, and may be disposed on each of some of the conductive pads 322. For still another example, when there are a plurality of conductive pads 322, the conductive members 340 may not have a number corresponding to the conductive pads 322, and one conductive member 340 may be disposed on two or more conductive pads 322. For example, the conductive member 340 may be bonded to the conductive pad 322 by being soldered, but is not limited thereto.

According to an embodiment, the conductive member 340 may extend from the conductive pad 322 to have a length. For example, the conductive member 340 may extend from the conductive pad 322 along a direction in which one surface **320*a* of the printed circuit board 320 faces. According to an embodiment, the conductive member 340 may be bent without extending linearly. For example, one end of the conductive member 340 in contact with the conductive pad 322 may be bent with respect to the direction in which the one surface 320*a* of the printed circuit board 320 faces. For another example, the other end of the conductive member 340 facing one end of the conductive member 340 in contact with the conductive pad 322 may be bent with respect to a direction in which one surface 320*a* of the printed circuit board 320 faces. According to an embodiment, a cross-section of the conductive member 340 cut in a direction substantially perpendicular to a direction in which one surface 320*a* of the printed circuit board 320 is facing may be circular, but is not limited thereto, and may be variously changed such as a polygon. According to an embodiment, the conductive member 340 may comprise a hole formed inside the conductive member 340. For example, the hole inside the conductive member 340 may extend along a direction in which one surface 320*a* of the printed circuit board 320 faces, but is not limited to it. According to another embodiment, the conductive member 340 may not comprise a hole inside the conductive member 340**.

The shielding member 350 may electrically shield the electronic component 310 from the outside of the printed circuit board 320 and/or from other regions of the printed circuit board 320 except for the first region 321. According to an embodiment, the shielding member 350 isolates the first region 321 from the outside of the printed circuit board 320 by surrounding and/or covering the electronic component 310 and the conductive member 340. For example, the shielding member 250 may completely cover the first region 321. The shielding member 350 may spatially isolate the first region 321 from the outside of the printed circuit board 320 and/or other regions of the printed circuit board 320 except for the first region 321 by surrounding and/or covering the electronic component 310 and the conductive member 340. For example, the shielding member 350 may completely cover the electronic component 310 and the conductive member 340. The shielding member 350 may comprise a material that is deformed by heat such as thermoplastic. For example, the shielding member 350 may comprise a material that is shrunk as it is heated. The shielding member 350 may be shrunk according to the shape of the contacting members. The shielding member 350 may be shrunk by heat applied to the shielding member 350 to surround and/or cover the electronic component 310 in contact with the shielding member 350 and the conductive member 340 in contact with the shielding member 350. For example, the electronic component 310 and/or the conductive member 340 may be in direct contact with the shielding member 350.

According to an embodiment, the shielding member 350 may be electrically connected to the ground line of the printed circuit board 320. For example, the shielding member 350 may comprise a conductive material and may be in contact with the conductive member 340. As the shielding member 350 contacts the conductive member 340, the shielding member 350 may be electrically connected to the ground line of the printed circuit board 320 through the conductive member 340 and the conductive pad 322. As the shielding member 350 is electrically connected to the ground line, the shielding member 350 may electrically isolate the first region 321 from the outside of the printed circuit board 320 and/or other regions of the printed circuit board 320 except for the first region 321. In a state electrically isolated by the shielding member 350, the electronic component 310 may not be affected by electromagnetic waves transmitted through other paths other than the signal line of the printed circuit board 320.

According to an embodiment, the shielding member 350 may surround and/or cover at least a part of the outer surface of the conductive member 340. For example, a part of the shielding member 350 may be spaced apart from the conductive pad 322 since the shielding member 350 surrounds and/or covers only a part of the outer surface of the conductive member 340. For another example, a part of the shielding member 350 may be in contact with the conductive pad 322 since the shielding member 350 surrounds and/or covers the entire outer surface of the conductive member 340. When the shielding member 350 surrounds and/or covers at least a part of the outer surface of the conductive member 340, the shielding member 350 may be firmly fixed on the printed circuit board 320. For example, when the electronic device 101 does not comprise the conductive member 340, the shielding member 350 may directly contact the conductive pad 322. When the shielding member 350 directly contacts the conductive pad 322, the shielding member 350 may not sufficiently secure a contact area for being firmly supported on the printed circuit board 320. The electronic device 101 according to an embodiment may sufficiently secure a contact area to be firmly supported on the printed circuit board 320, since the shielding member 350 surrounds and/or covers the outer surface of the conductive member 340 disposed on the conductive pad 322.

As described above, the electronic device 101 according to an embodiment may shield the first region 321 in which the electronic component 310 is disposed, since the shielding member 350 surrounds and/or covers the electronic component 310 and the conductive member 340. Since the electronic device 101 according to an embodiment may comprise the conductive member 340 disposed on the conductive pad 322, the shielding member 350 may be firmly disposed on the printed circuit board 320.

Figure 4:
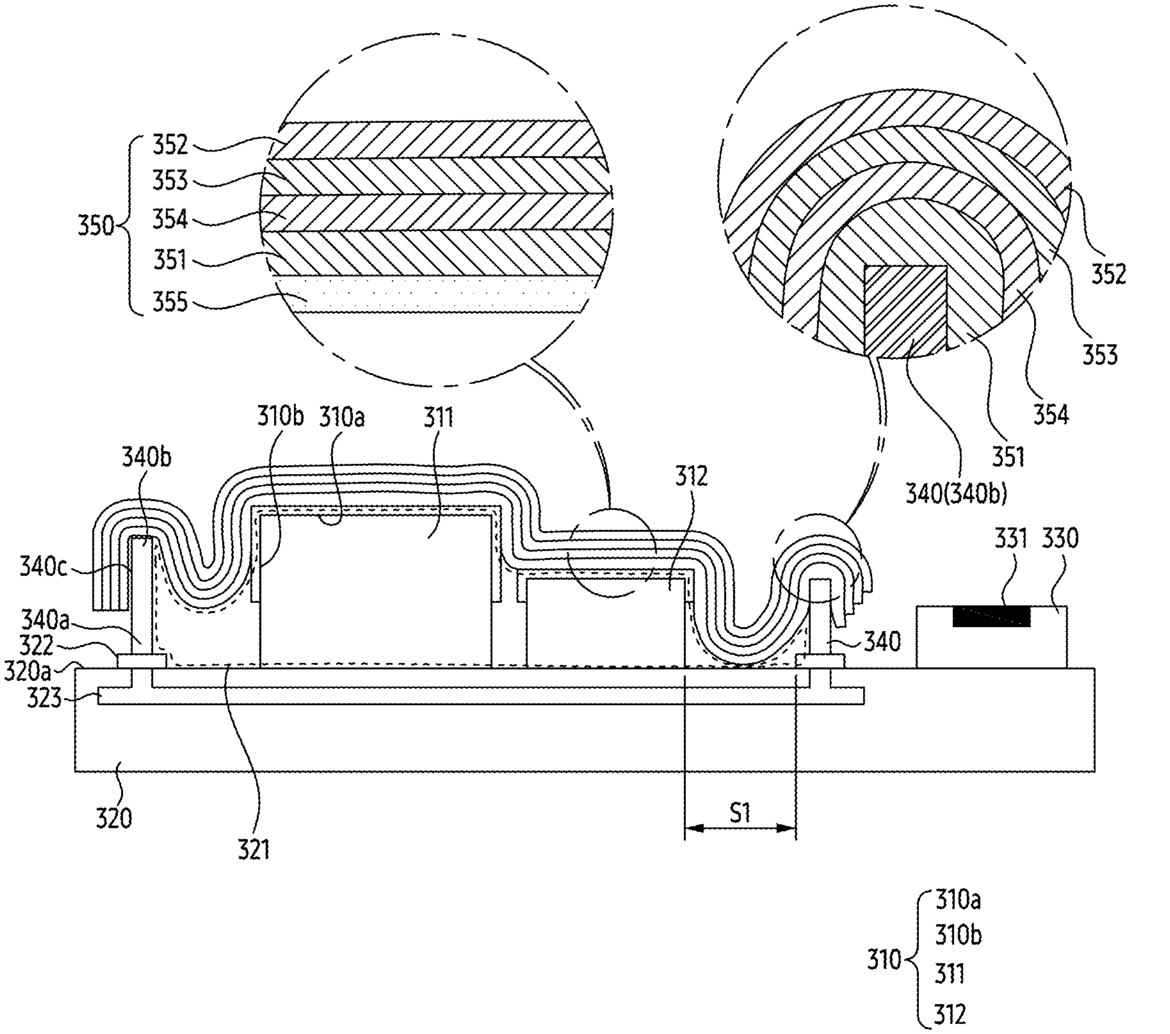
FIG. 4 is a cross-sectional view illustrating an example in which a printed circuit board of an electronic device is cut along A-A' of FIG. 3, according to an embodiment.

FIG. 4 is a cross-sectional view illustrating an example in which a printed circuit board 320 of an electronic device is cut along A-A' of FIG. 3, according to an embodiment.

Referring to FIG. 4, according to an embodiment, the electronic component 310 may comprise a plurality of electronic components 311 and 312 spaced apart from each other and disposed on one surface 320*a* of the printed circuit board 320.

According to an embodiment, the printed circuit board 320 comprises a conductive layer 323, wherein the conductive layer 323 may form a ground line. The conductive layer 323 may form a ground line of the printed circuit board 320. According to an embodiment, the conductive layer 323 is electrically connected to the conductive pad 322 exposed to the outside of the printed circuit board 320.

According to an embodiment, the conductive member 340 may extend from the conductive pad 322 along a direction in which one surface 320*a* of the printed circuit board 320 faces. One end 340*a* of the conductive member 340 may be in contact with the conductive pad 322, and the other end 340*b* of the conductive member 340 may be in contact with the shielding member 350. According to an embodiment, the conductive member 340 may be electrically connected to the conductive layer 323 of the printed circuit board 320 by being disposed on the conductive pad 322.

According to an embodiment, the shielding member 350 may comprise an adhesive layer 351, a non-conductive layer 352, a shielding layer 353, a radiating layer 354, and/or a separating layer 355.

The adhesive layer 351 may fix the shielding member 350 on the printed circuit board 320. According to an embodiment, the adhesive layer 351 may be adhered to the conductive member 340. For example, the adhesive layer 351 may comprise a hot melt coating material that is viscous when heated above a specified temperature and hardens when cooled below a specified temperature. For another example, the adhesive layer 351 may be a pressure sensitive adhesive that bonds to a target material when pressed to a specified pressure or more, but is not limited thereto. According to an embodiment, the adhesive layer 351 may comprise a conductive material to be electrically connected to the conductive member 340. For example, the conductive material comprised in the adhesive layer 351 may be distributed in the region of the adhesive layer 351 in the form of powder, but is not limited thereto. As the adhesive layer 351 comprises a conductive material, the adhesive layer 351 may electrically connect the conductive member 340 and the shielding layer 353.

The non-conductive layer 352 may be disposed on the adhesive layer 351. According to an embodiment, the non-conductive layer 352 is not shrunk at a temperature below room temperature, but may be shrunk as it is heated to a temperature above a specified temperature. For example, the non-conductive layer 352 may be shrunk by being heated for at least 10 minutes from a heat source of approximately above 70° C. According to an embodiment, the non-conductive layer 352 may comprise a heat shrinkable film having a shrinkage rate of approximately above 30%. For example, the non-conductive layer 352 may comprise polyethylene terephthalate (PET), but is not limited thereto.

The shielding layer 353 may shield electromagnetic waves transmitted to the first region 321. According to an embodiment, the shielding layer 353 may be made of a conductive material. For example, the shielding layer 353 may be formed on one surface of the non-conductive layer 352 through a deposition process. For example, the shielding layer 353 may be formed through a sputtering process during a physical vapor deposition (PVD) process. For another example, the shielding layer 353 may comprise a carbon nanotube (CNT) having conductivity as a material. According to an embodiment, the shielding layer 353 may be interposed between the adhesive layer 351 and the non-conductive layer 352. For example, the shielding layer 353 may be disposed such that one surface thereof contacts the non-conductive layer 352 and the other surface thereof contacts the radiating layer 354, but is not limited thereto.

The radiating layer 354 may emit heat generated in the first region 321 of the printed circuit board 320 to the outside of the first region 321. For example, the radiating layer 354 may comprise graphite as a material, but is not limited thereto. According to an embodiment, the radiating layer 354 may be interposed between the adhesive layer 351 and the non-conductive layer 352. For example, one surface of the radiating layer 354 may contact the adhesive layer 351, and the other surface of the radiating layer 354 may contact the shielding layer 353, but is not limited thereto.

The separating layer 355, by being made of a non-conductive material, may prevent a plurality of electronic components 311 and 312 from being electrically short-circuited through a conductive material of the adhesive layer 351 and/or a shielding layer 353. According to an embodiment, the separating layer 355 may be interposed between the adhesive layer 351 and the electronic component 310. For example, one surface of the separating layer 355 may surround a part of a plurality of electronic components 311 and 312, and the other surface of the separating layer 355 may contact the adhesive layer 351. According to an embodiment, the separating layer 355 may be disposed in a region corresponding to each of a plurality of electronic components 311 and 312 among regions of the adhesive layer 351. The separating layer 355 may not be disposed in regions of the adhesive layer 351 except for regions corresponding to each of the plurality of electronic components 311 and 312.

FIG. 4 illustrates that the shielding member 350 comprises all of the adhesive layer 351, the non-conductive layer 352, the shielding layer 353, and the radiating layer 354, but this is for convenience of description. For example, the shielding member 350 may comprise only the adhesive layer 351 and the non-conductive layer 352. For another example, the shielding member 350 may comprise the adhesive layer 351 and the non-conductive layer 352, and may further comprise only one of the shielding layer 353 and the radiating layer 354. For example, the adhesive layer 351, the radiating layer 354, the shielding layer 353 and the non-conductive layer 352 may be directly disposed on top of each other in the order stated.

According to an embodiment, the shielding member 350 may be in close contact with the conductive member 340 and the electronic component 310 by being shrunk by heating. As shrunk by the heating, the region of the shielding member 350 corresponding to the conductive member 340 and the region of the shielding member 350 corresponding to the electronic component 310 may be bent. As the shielding member 350 is bent, the shielding member 350 may surround at least a part of the other end 340*b* of the conductive member 340 and the side surface 340*c* of the conductive member 340. The shielding member 350 may surround one surface 310*a* of the electronic component 310 and the side surface 310*b* of the electronic component 310 facing a direction parallel to a direction in which the one surface 320*a* of the printed circuit board 320 faces. The shielding member 350 may be firmly fixed on the printed circuit board 320 by being in close contact with the electronic component 310 and the conductive member 340.

According to an embodiment, the sum of the height of the conductive member 340 and the height of the conductive pad 322 may be smaller than the height of the electronic component 310. The height may refer to a length extending along a direction toward one surface 320*a* of the printed circuit board 320 from one surface 320*a* of the printed circuit board 320. For example, the sum of the height of the conductive member 340 and the height of the conductive pad 322 may be smaller than the height of the electronic component 311 having a greater height among the electronic components 311 and 312 having different heights. For another example, the sum of the height of the conductive member 340 and the height of the conductive pad 322 may be smaller than the height of the electronic component 312 having a lower height among the electronic components 311 and 312 having different heights.

According to an embodiment, the conductive member 340 may compensate for a height difference existing between the electronic component 310 and the conductive pad 322. For example, in the absence of the conductive member 340, the shielding member 350 may directly contact the conductive pad 322. When the shielding member 350 directly contacts the conductive pad 322, the shielding member 350 may have a slope with respect to the conductive pad 322 due to a height difference between the electronic component 310 and the conductive pad 322. Since the slope between the shielding member 350 and the conductive pad 322 should be small in order to secure a contact area between the shielding member 350 and the conductive pad 322, the separating distance s1 between the electronic component 310 and the conductive pad 322 may increase. When the separating distance s1 between the electronic component 310 and the conductive pad 322 increases, the size of the printed circuit board 320 increases, and thus a mounting space of the electronic device (e.g., the electronic device 101 of FIGS. 1 and 2) may be wasted. When the separating distance s1 between the electronic component 310 and the conductive pad 322 increases, since the shielding member 350 covers the accommodating groove 331 of the connector 330 by decrease in the distance between the conductive pad 322 and the connector 330, the printed circuit board 320 may not be electrically connected to other printed circuit boards. According to an embodiment, the electronic device 101 may compensate for a height difference existing between the electronic component 310 and the conductive pad 322 by disposing the conductive member 340 on the conductive pad 322. As the height difference is compensated, the separating distance s1 between the electronic component 310 and the conductive pad 322 may be decreased, and thus the electronic device 101 may secure a mounting space for mounting various components.

As described above, the electronic device 101 according to an embodiment may secure a mounting space by disposing the conductive member 340 on the conductive pad 322 to decrease a separating distance s1 between the electronic component 310 and the conductive pad 322. According to an embodiment, the electronic device 101 may secure a mounting space for mounting various components as the sum of the height of the conductive member 340 and the height of the conductive pad 322 is smaller than the height of the electronic component 310.

Figure 5:
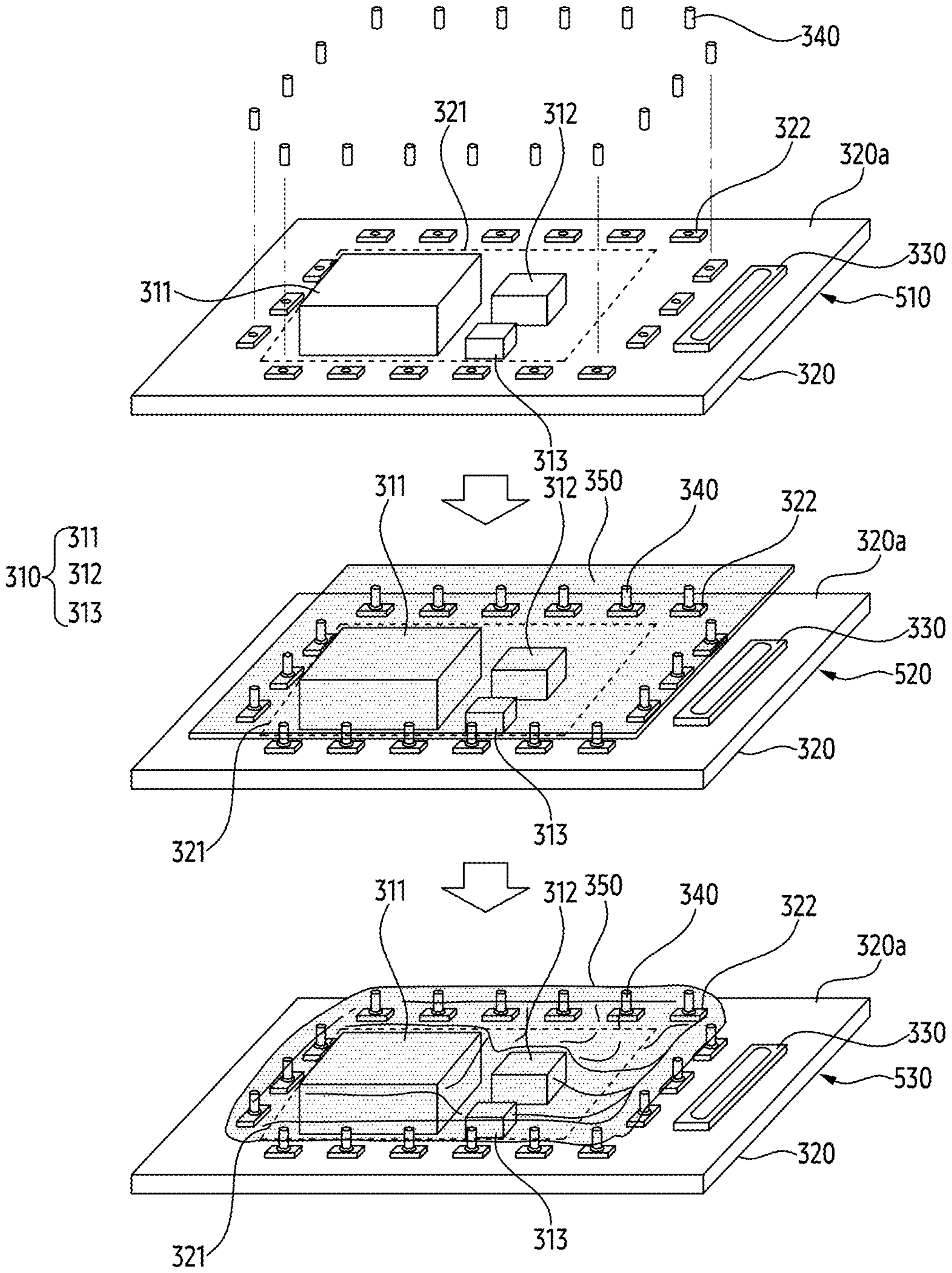
FIG. 5 illustrates an example of a method of manufacturing a shielding structure of an electronic device according to an embodiment.

FIG. 5 illustrates an example of a method of manufacturing a shielding structure of an electronic device according to an embodiment.

Referring to FIG. 5, a method of manufacturing the shielding structure of the electronic device (e.g., the electronic device 101 of FIG. 1) described above may be as follows.

In process 510, the conductive member 340 may be disposed on the conductive pad 322 of the printed circuit board 320. For example, the conductive member 340 may be fixed on the conductive pad 322 by being soldered.

In process 520, the shielding member 350 may be disposed on the first region 321 in which the electronic component 310 is disposed. According to an embodiment, the size of the cross-sectional area of the shielding member 350 may be greater than the size of the first region 321. The shielding member 350 may be substantially flat surface to be parallel to one surface 320*a* of the printed circuit board 320, but is not limited thereto. For example, the shielding member 350 may have a curve to correspond to the shape of the first region 321 in which the electronic component 310 and the conductive member 340 are disposed in a state before being heated.

In process 530, the shielding member 350 may be shrunk by being heated. For example, the shielding member 350 may be shrunk by being heated for at least above 10 minutes by a heat source of approximately above 70° C. The shielding member 350 may surround and/or cover the conductive member 340 and the electronic component 310 by being shrunk.

As described above, the electronic device 101 according to an embodiment may secure a mounting space for mounting various components by disposing the conductive member 340 on the conductive pad 322.

Figure 6A:
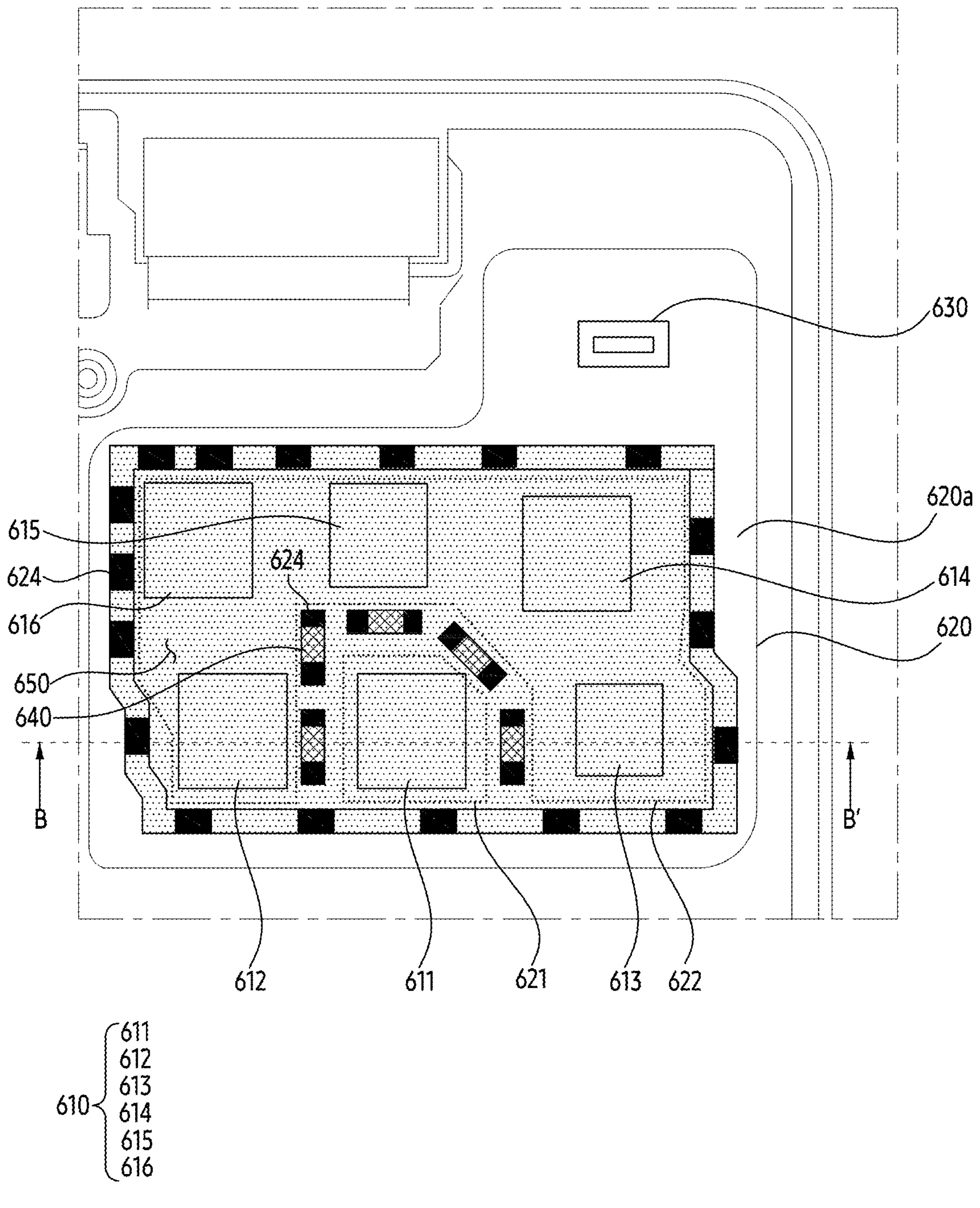
FIG. 6A is a top view of a printed circuit board of an electronic device according to an embodiment.
Figure 6B:
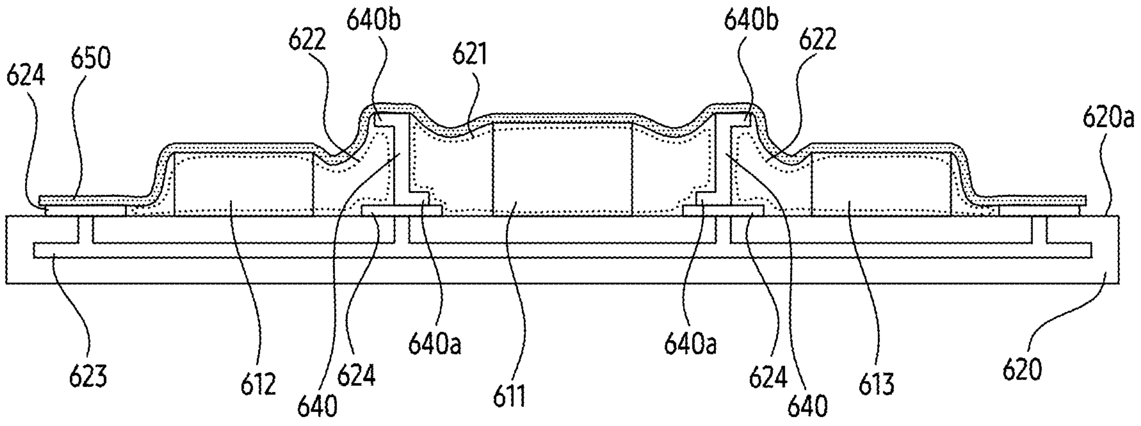
FIG. 6B is a cross-sectional view illustrating an example in which a printed circuit board of an electronic device is cut along B-B' of FIG. 6A, according to an embodiment.

FIG. 6A is a top view of a printed circuit board of an electronic device according to an embodiment, and FIG. 6B is a cross-sectional view illustrating an example in which a printed circuit board of an electronic device is cut along B-B' of FIG. 6A, according to an embodiment.

Referring to FIGS. 6A and 6B, according to an embodiment, the electronic device (e.g., the electronic device 101 of FIG. 1 and/or FIG. 2) may comprise an electronic component 610, a printed circuit board 620, a connector 630, a conductive member 640, and a shielding member 650. Since the electronic component 610, a printed circuit board 620, a connector 630, a conductive member 640 and a shielding member 650 of FIGS. 6A and/or 6B may be substantially the same as the electronic component 310, the printed circuit board 320, the connector 330, the conductive member 340, and the shielding member 350 of FIG. 3, respectively, overlapping descriptions will be omitted.

According to an embodiment, the electronic component 610 may be disposed on one surface 620*a* of the printed circuit board 620. The electronic component 610 may comprise a plurality of electronic components 611, 612, 613, 614, 615, and 616 spaced apart from each other and disposed on the printed circuit board 620. For example, some of the electronic components 611 of the plurality of electronic components 611, 612, 613, 614, 615, and 616 may be disposed in the first region 621 on the printed circuit board 620, some of the remaining electronic components 612, 612, 613, 614, 615, and 616 of the plurality of electronic components 611, 612, 613, 615, and 616 may be disposed in the second region 622 on the printed circuit board.

According to an embodiment, the printed circuit board 620 comprised a conductive layer 623, wherein the conductive layer 623 may form a ground line of the printed circuit board 620. The printed circuit board 620 further comprises a conductive pad 624 electrically connected to the conductive layer 623. The conductive pad 624 may be exposed to the outside of the printed circuit board 620 through one surface 620*a* of the printed circuit board 620. According to an embodiment, the conductive pad 624 may surround the electronic component 610 disposed on the printed circuit board 620. For example, the conductive pad 624 may surround at least a part of a periphery of the first region 621 on which the electronic component 610 is disposed and at least a part of a periphery of the second region 622. The conductive pad 624 may comprise a plurality of conductive pads 624 spaced apart from each other and surrounding at least a part of the periphery of the first region 621 and at least a part of the periphery of the second region 622.

According to an embodiment, the connector 630 may be disposed outside the first region 621 and the second region 622.

According to an embodiment, the conductive member 640 is disposed on the conductive pad 624 and may be electrically connected to the conductive layer 623 of the printed circuit board 620. According to an embodiment, the conductive member 640 may surround at least a part of a periphery of the first region 621. For example, the conductive member 640 may comprise a plurality of conductive members 640 that surround only a part of the periphery of the first region 621 and are spaced apart from each other. A plurality of conductive members 640 may form an open curve by surrounding only a part of the periphery of the first region 621.

According to an embodiment, the conductive member 640 may be extended from the conductive pad 624 along a direction in which the one surface 620*a* of the printed circuit board 620 faces. According to an embodiment, the conductive member 640 may be bent without extending in a straight line. For example, one end 640*a* of the conductive member 640 in contact with the conductive pad 624 may be bent substantially perpendicular to a direction in which one surface 620*a* of the printed circuit board 620 faces. As one end 640*a* of the conductive member 640 is bent, a contact area between the conductive member 640 and the conductive pad 624 increases, and thus the conductive member 640 may be firmly fixed on the conductive pad 624. For another example, the other end 640*b* of the conductive member 640 facing one end 640*a* of the conductive member 640 may be bent substantially perpendicular to a direction in which one surface 620*a* of the printed circuit board 620 faces. As the other end 640*b* of the conductive member 640 is bent, a contact area between the conductive member 640 and the shielding member 650 is increased, and thus the shielding member 650 may be firmly fixed on the printed circuit board 620.

According to an embodiment, the shielding member 650 may electrically shield the first region 621 and the second region 622 of the printed circuit board 620 from the outside of the printed circuit board 620. The shielding member 650 surrounds and/or covers at least a part of the electronic component 610 and the conductive member 640, and may contact the conductive pad 624. The shielding member 650 is electrically connected to the conductive layer 623 of the printed circuit board 620 and may be connected through the conductive member 640 and the conductive pad 624. As the shielding member 650 is electrically connected to the conductive layer 623, the shielding member 650 may electrically isolate the first region 621 and the second region 622 from the outside of the printed circuit board 620. In a state electrically isolated by the shielding member 650, the electronic component 610 may not be affected by electromagnetic waves transmitted to other paths other than the signal line of the printed circuit board 620. According to an embodiment, the shielding member 650 may spatially isolate the first region 621 and the second region 622 from the outside of the printed circuit board 620 by surrounding the first region 621 and the second region 622.

According to an embodiment, the conductive member 640 may divide the first region 621 and the second region 622 by being disposed between the first region 621 and the second region 622. For example, the conductive member 640 may be disposed on the conductive pad 624 disposed on a part of a periphery of the first region 621 so as to surround only a part of the periphery of the first region 621. As the conductive member 640 is disposed on the conductive pad 624, the conductive member 640 may be electrically connected to the conductive layer 623 and may electrically divide the first region 621 and the second region 622. For example, the electronic components 612, 613, 614, 615, and 616 disposed in the second region 622 may be affected by electromagnetic waves emitted from the electronic component 611 disposed in the first region 621. When the conductive member 640 does not divide the first region 621 and the second region 622, in order to shield the first region 621 and the second region 622, a plurality of shielding members 650 for shielding each of the first region 621 and the second region 622 may be required. When a plurality of shielding members 650 are disposed, a cost for manufacturing a shielding structure of the electronic device 101 may increase. When a plurality of shielding members 650 are disposed, the plurality of shielding members 650 may share a conductive pad 624 disposed at the boundary between the first region 621 and the second region 622. When the conductive pad 624 is shared, an area in which each of the plurality of shielding members 650 contacts the conductive pad 624 may be smaller than an area in which one shielding member 650 contacts the conductive pad 624. As the area in contact with the conductive pad 624 is reduced, a shielding structure including a plurality of shielding members 650 for shielding each of the first region 621 and the second region 622 may be more unstable than a shielding structure including one shielding member 650. According to an embodiment, since the electronic device 101 may divide the first region 621 and the second region 622 through the conductive member 640 while surrounding the first region 621 and the second region 622 with one shielding member 650, the electronic device 101 may comprise a stable shielding structure.

As described above, the electronic device 101 according to an embodiment may divide the first region 621 and the second region 622 through the conductive member 640, thereby including a solid shielding structure and reducing the cost of manufacturing the shielding structure.

Figure 7A:
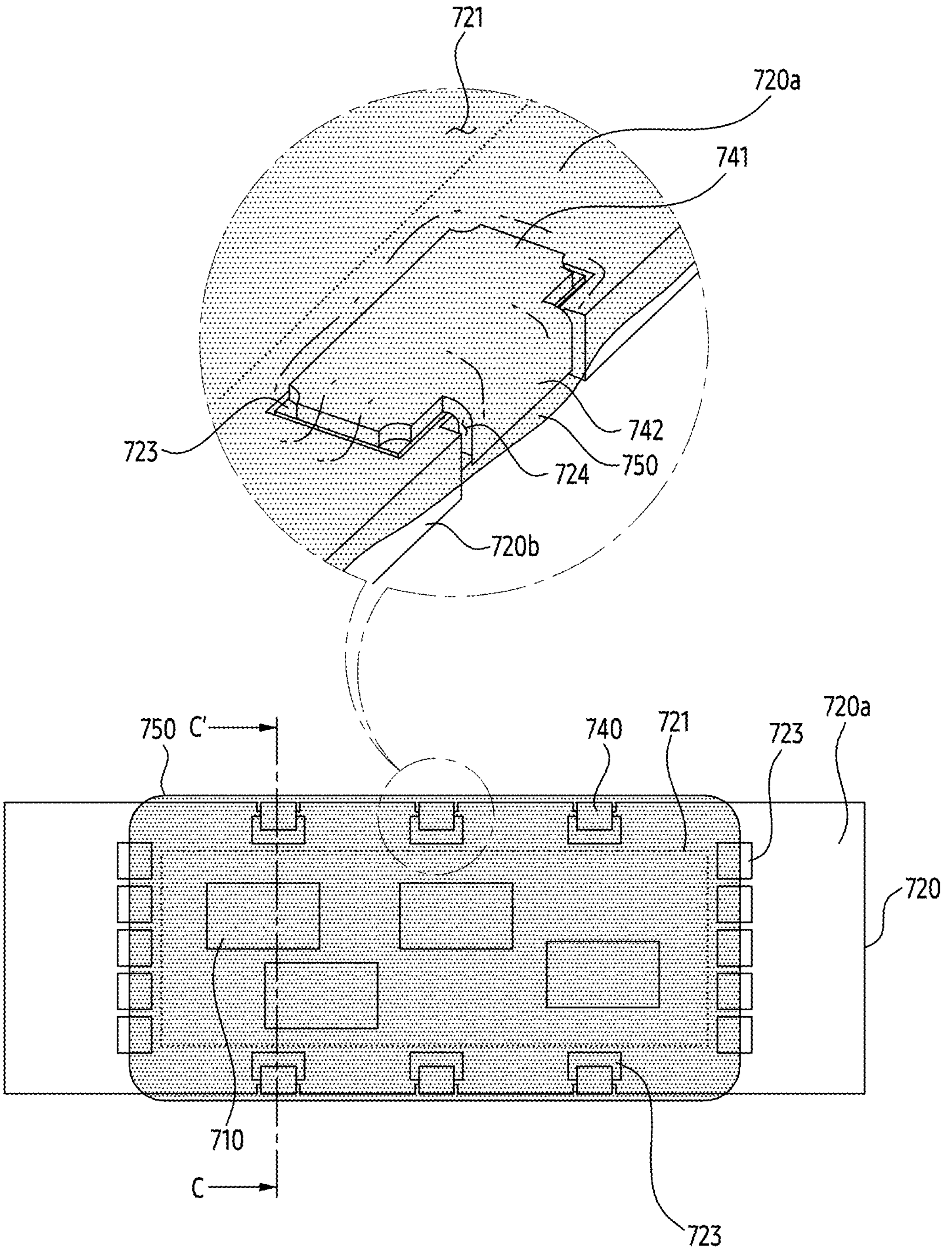
FIG. 7A is a top view of a printed circuit board of an electronic device according to an embodiment.
Figure 7B:
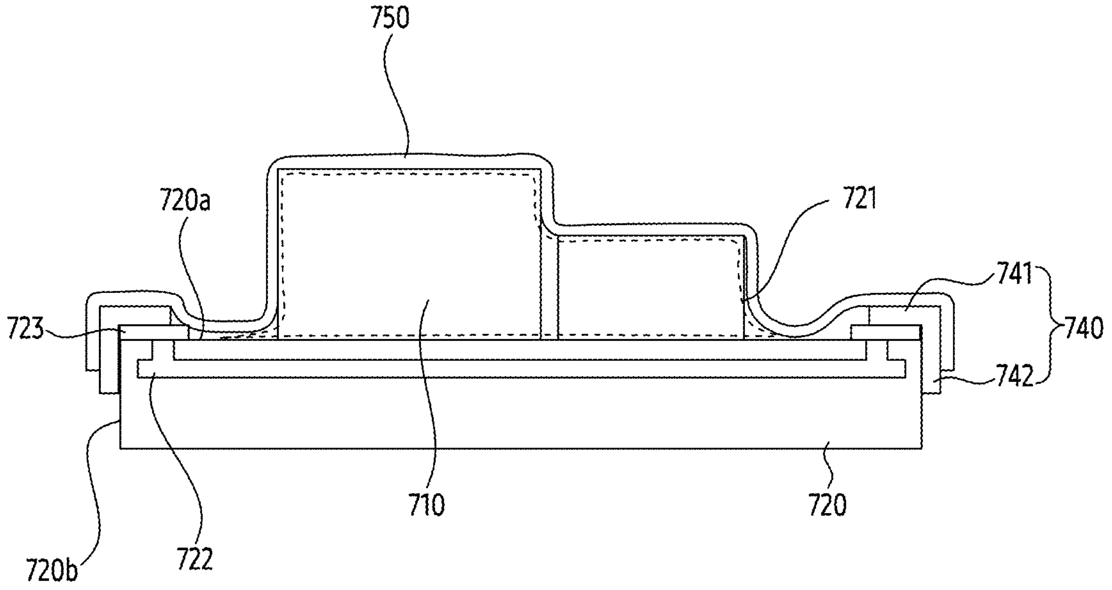
FIG. 7B is a view illustrating an example in which a printed circuit board of an electronic device is cut along C-C' of FIG. 7A, according to an embodiment.

FIG. 7A is a top view of a printed circuit board of an electronic device according to an embodiment, and FIG. 7B is a view illustrating an example in which a printed circuit board of an electronic device is cut along C-C' of FIG. 7A, according to an embodiment.

Referring to FIGS. 7A and 7B, the electronic device (e.g., the electronic device 101 of FIG. 1 and/or FIG. 2) according to an embodiment may comprise an electronic component 710, a printed circuit board 720, a conductive member 740, and a shielding member 750. Since the electronic component 710, the printed circuit board 720, the conductive member 740, and the shielding member 750 of FIGS. 7A and/or 7B may be substantially the same as the electronic component 310, the printed circuit board 320, the conductive member 340, and the shielding member 350 of FIG. 3, respectively, overlapping descriptions will be omitted.

According to an embodiment, the electronic component 710 may be disposed on one surface 720*a* of the printed circuit board 720. For example, the electronic component 710 may be disposed in a first region 721 on the printed circuit board 720.

According to an embodiment, the printed circuit board 720 may comprise a conductive layer 722 for forming a ground line of the printed circuit board 720 and a conductive pad 723 electrically connected to the conductive layer 722. The conductive pad 723 may be exposed to the outside of the printed circuit board 720 through one surface 720*a* of the printed circuit board 720. According to an embodiment, the conductive pad 723 may surround at least a part of a periphery of the first region 721 on which the electronic component 710 is disposed. The conductive pad 723 may comprise a plurality of conductive pads 723 surrounding the first region 721 and spaced apart from each other. According to an embodiment, some of the conductive pads 723 of the plurality of conductive pads 723 may be disposed on the periphery of the one surface 720*a* of the printed circuit board 720. According to an embodiment, the printed circuit board 720 may comprise a coupling groove 724 formed at a periphery of the printed circuit board 720. The coupling groove 724 may be formed by denting the side surface 720*b* of the printed circuit board 720 inward.

According to an embodiment, a conductive member 740 may be disposed on the conductive pad 723 to be electrically connected to the conductive layer 722 of the printed circuit board 720. For example, the conductive member 740 may be disposed on some of the conductive pads 723 disposed on the periphery of the one surface 720*a* of the printed circuit board 720 among the plurality of conductive pads 723. According to an embodiment, the conductive member 740 may extend from the conductive pad 723 along the outer surface of the printed circuit board 720 to the side surface 720*b* of the printed circuit board 720. For example, the conductive member 740 may extend from the conductive pad 723 to the side surface 720*b* of the printed circuit board 720 along the coupling groove 724 formed at a periphery of the printed circuit board 720. According to an embodiment, the conductive member 740 may comprise a contacting portion 741 disposed on the conductive pad 723 and a bending portion 742 that is bent with respect to the contacting portion 741 and at least a part thereof is accommodated in the coupling groove 724.

According to an embodiment, the shielding member 750 may electrically shield the first region 721 of the printed circuit board 720 from the outside of the printed circuit board 720. The shielding member 750 may surround the electronic component 710 and the conductive member 740, and may contact the conductive pad 723. The shielding member 750 may be electrically connected to the conductive layer 722 of the printed circuit board 720 through the conductive member 740 and the conductive pad 723. According to an embodiment, the shielding member 750 may surround at least a part of one surface 720*a* and a side surface 720*b* of the printed circuit board 720. For example, the shielding member 750 may be in contact with a contacting portion 741 disposed on one surface 720*a* of the printed circuit board 720 and a bending portion 742 in contact with the side surface 720*b* of the printed circuit board 720.

As described above, the electronic device 101 according to an embodiment may be disposed such that the shielding member 750 surrounds one surface 720*a* and the side surface 720*b* of the printed circuit board 720 to isolate the first region 721 from the outside of the printed circuit board 720. According to an embodiment, the electronic device 101 may comprise a shielding structure with a relatively low height by extending the conductive member 740 toward the side 720*b* along the outer surface of the printed circuit board 720 rather than in a direction toward the one surface 720*a* of the printed circuit board 720.

Figure 8A:
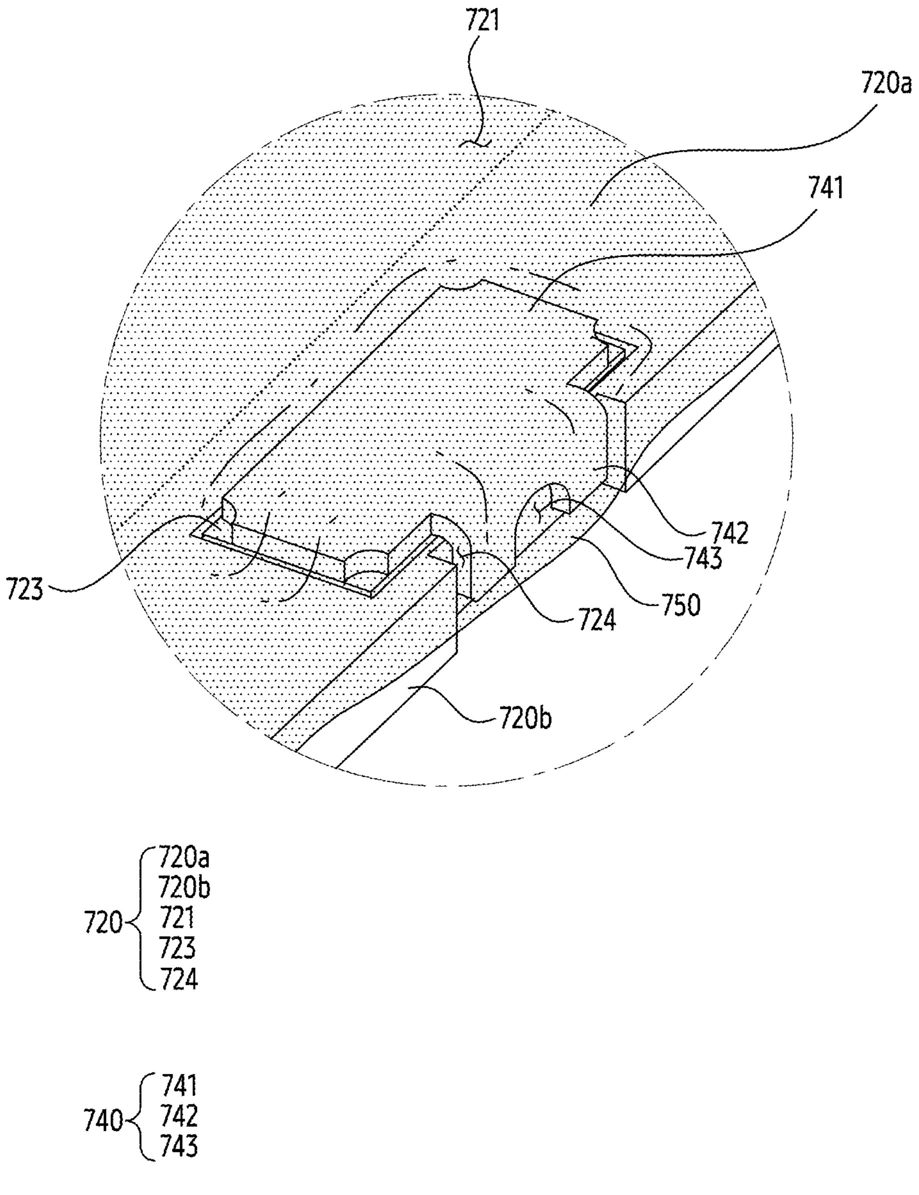
FIG. 8A illustrates an example of a conductive member disposed on a printed circuit board of an electronic device, according to an embodiment.
Figure 8B:
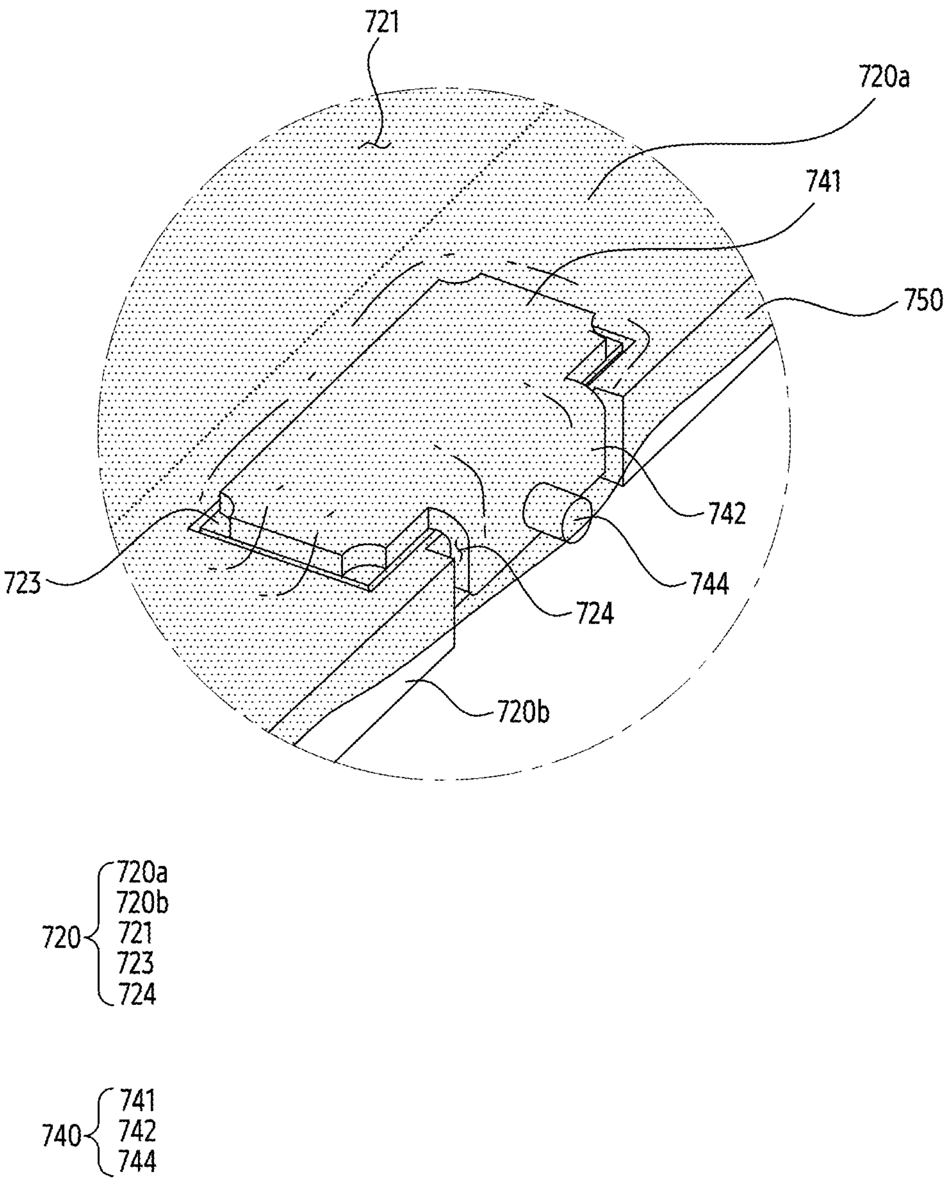
FIG. 8B illustrates another example of a conductive member disposed on a printed circuit board of an electronic device, according to an embodiment.

FIG. 8A illustrates an example of a conductive member disposed on a printed circuit board of an electronic device, according to an embodiment, and FIG. 8B illustrates another example of a conductive member disposed on a printed circuit board of an electronic device, according to an embodiment.

The conductive member 740 of FIGS. 8A and 8B may be a conductive member 740 to which one of an adhesive groove 743 and an adhesive protrusion 744 is added in the conductive member 740 of FIGS. 7A and/or 7B, respectively, and overlapping descriptions will be omitted.

According to an embodiment, the conductive member 740 may comprise an adhesive groove 743. The adhesive groove 743 may be formed in the bending portion 742 of the conductive member 740 in contact with the side surface 720*b* of the printed circuit board 720. For example, the adhesive groove 743 may be formed by punching a part of the bending part 742, or may be formed by denting a part of the bending part 742 in a direction toward the side surface

720*b* of the printed circuit board 720. As the adhesive groove 743 is formed in the conductive member 740, the shielding member 750 contacts the inner surface of the adhesive groove 743, and thus a contact area between the shielding member 750 and the conductive member 740 may increase. As the contact area between the shielding member 750 and the conductive member 740 increases, the electronic device (e.g., the electronic device 101 of FIG. 1 and/or FIG. 2) may comprise a solid shielding structure.

According to an embodiment, the conductive member 740 may comprise an adhesive protrusion 744. The adhesive protrusion 744 may be formed on the bending portion 742 of the conductive member 740 in contact with the side surface 720*b* of the printed circuit board 720. For example, the adhesive protrusion 744 may be formed by protruding a part of the bending portion 742 along a direction in which the side surface 720*b* of the printed circuit board 720 faces from the outer surface of the bending portion 742. As the adhesive protrusion 744 is formed on the conductive member 740, the shielding member 750 contacts the outer surface of the adhesive protrusion 744, and thus a contact area between the shielding member 750 and the conductive member 740 may increase. As the contact area between the shielding member 750 and the conductive member 740 increases, the electronic device 101 may comprise a solid shielding structure.

As described above, the electronic device 101 according to an embodiment may comprise a solid shielding structure as the conductive member 740 comprises an adhesive groove 743 or an adhesive protrusion 744 and a contact area between the shielding member 750 and the conductive member 740 is increased.

Figure 9A:
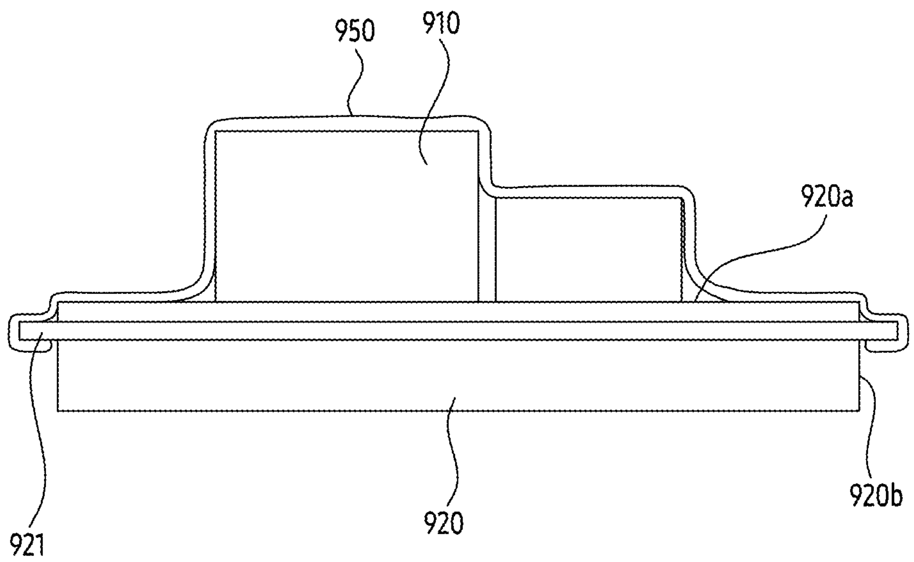
FIG. 9A is a cross-sectional view illustrating an example of a cross-section of a printed circuit board of an electronic device, according to an embodiment.
Figure 9B:
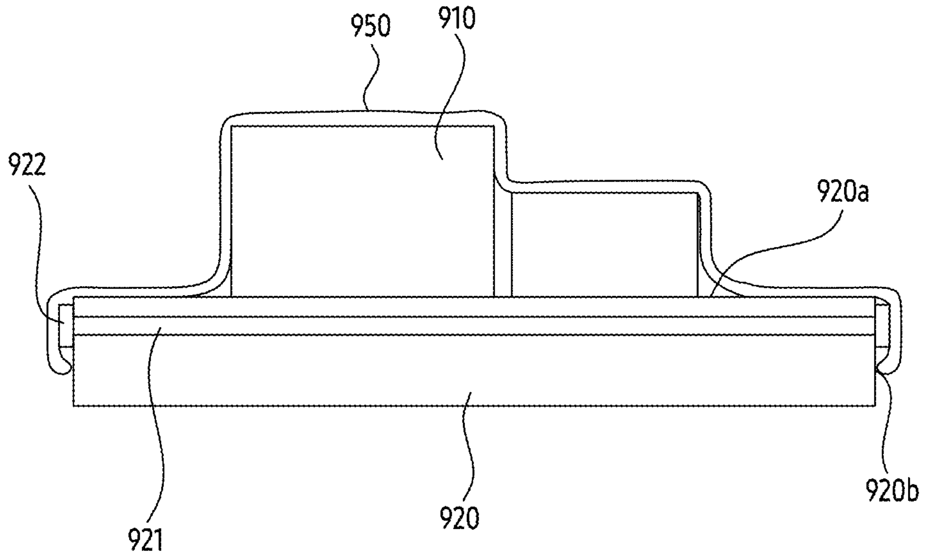
FIG. 9B is a cross-sectional view illustrating another example of a cross-section of a printed circuit board of an electronic device, according to an embodiment.

FIG. 9A is a cross-sectional view illustrating an example of a cross-section of a printed circuit board of an electronic device, according to an embodiment, and FIG. 9B is a cross-sectional view illustrating another example of a cross-section of a printed circuit board of an electronic device, according to an embodiment.

Referring to FIGS. 9A and 9B, the electronic device (e.g., the electronic device 101 of FIG. 1 and/or FIG. 2) according to an embodiment may comprise an electronic component 910, a printed circuit board 920, and a shielding member 950. Since the electronic component 910, the printed circuit board 920, and the shielding member 950 of FIG. 9A and/or FIG. 9B may be substantially the same as the electronic component 310, the printed circuit board 320, and the shielding member 350 of FIG. 3, respectively, overlapping descriptions will be omitted.

According to an embodiment, the electronic component 910 may be disposed on one surface 920*a* of the printed circuit board 920. The electronic component 910 may be electrically connected to the printed circuit board 920.

According to an embodiment, the printed circuit board 920 may comprise a conductive layer 921 for forming a ground line of the printed circuit board 920. The conductive layer 921 may be partially exposed through a side surface 920*b* facing in a direction substantially perpendicular to a direction toward one surface 920*a* of the printed circuit board 920. For example, a part of the conductive layer 921 may be exposed to the outside of the printed circuit board 920 by protruding from the side surface 920*b* of the printed circuit board 920. For another example, the printed circuit board 920 may comprise a conductive coating layer 922 disposed on a part of the conductive layer 921 exposed through the side surface 920*b* of the printed circuit board 920. The conductive coating layer 922 may be a plating layer formed on a part of the conductive layer 921 exposed to the outside of the printed circuit board 920*b*.

According to an embodiment, the shielding member 950 may isolate one surface 920*a* of the printed circuit board 920 on which the electronic component 910 is disposed and the outside of the printed circuit board 920 by surrounding the electronic component 910 and the side surface 920*b* of the printed circuit board 920. For example, the shielding member 950 may spatially isolate one surface 920*a* of the printed circuit board 920 from the outside of the printed circuit board 920 by surrounding one surface 920*a* and the side surface 920*b* of the printed circuit board 920.

According to an embodiment, the shielding member 950 may be in contact with a part of the conductive layer 921 partially exposed through the side surface 920*b*. Since the shielding member 950 contacts a part of the conductive layer 921, the shielding member 950 may be electrically connected to the conductive layer 921. The shielding member 950 may be electrically connected to the conductive layer 921 to electrically isolate one side 920*a* of the printed circuit board 920 from the outside of the printed circuit board 920. In a state electrically isolated by the shielding member 950, the electronic component 910 may not be affected by electromagnetic waves transmitted through other paths other than the signal line of the printed circuit board 920.

According to an embodiment, the shielding member 950 may contact at least a part of the conductive coating layer 922 disposed on the side surface 920*b* of the printed circuit board 920. Since the shielding member 950 contacts at least a part of the conductive coating layer 922, the shielding member 950 may be electrically connected to the conductive layer 921. The shielding member 950 may be electrically connected to the conductive layer 921 to electrically isolate one side 920*a* of the printed circuit board 920 from the outside of the printed circuit board 920. In a state electrically isolated by the shielding member 950, the electronic component 910 may not be affected by electromagnetic waves transmitted through other paths other than the signal line of the printed circuit board.

As described above, the electronic device 101 according to an embodiment may be disposed so that the shielding member 950 surrounds one surface 920*a* and the side surface 920*b* of the printed circuit board 920 to isolate the one surface 920*a* from the outside of the printed circuit board 920. According to an embodiment, since the shielding member 950 directly contacts the conductive layer 921 partially exposed through the side surface 920*b* of the printed circuit board 920, the electronic device 101 may comprise a shielding structure having a relatively low height.

An electronic device (e.g., an electronic device 101 of FIG. 1 and/or FIG. 2) according to an embodiment may comprise a printed circuit board (e.g., printed circuit board 320 of FIG. 3) including a conductive layer (e.g., conductive layer 323 of FIG. 4) and a conductive pad (e.g., conductive pad 322 of FIG. 3) connected to the conductive layer and exposed to an outside of the printed circuit board; an electric component (e.g., an electronic component 310 of FIG. 3) disposed on a first region (e.g., a first region 321 of FIG. 1) of the printed circuit board and the electric component electrically connected to the printed circuit board; a conductive member (e.g., a conductive member 340 of FIG. 3) disposed on the conductive pad and the conductive member surrounding at least part of a periphery of the first region of the printed circuit board; and a shielding member (e.g., a shield member 350 of FIG. 3) isolating the first region of the printed circuit board from the outside of the printed circuit board by covering the electric component and the conductive member, the shielding member electrically connected to the conductive layer.

According to an embodiment, the printed circuit board may further comprise an another electric component different from the electric component, the another electric component disposed on a second region of the printed circuit board spaced apart the first region, the shielding member may isolate the first region and the second region from the outside of the printed circuit board by covering the first region and the second region, and the conductive member may divide the first region from the second region by being disposed between the first region and the second region.

According to an embodiment, the conductive member may extend from the conductive pad, in a direction in which one surface (e.g., one surface 320*a* of a printed circuit board 320 of FIG. 4) of the printed circuit board on which the electric component disposed faces.

According to an embodiment, one end of the conductive member (e.g., one end 340*a* of the conductive member 340 of FIG. 4) may be in contact with the conductive pad, and an another end of the conductive member (e.g., an another end 340*b* of the conductive member 340 of FIG. 4) facing the one end of the conductive member, the another end of the conductive member may be bent in a direction in which an one surface of the printed circuit board faces.

According to an embodiment, one end of the conductive member (e.g., one end 340*a* of the conductive member 340 of FIG. 4) in contact with the conductive pad may be bent in a direction in which one surface of the printed circuit board faces.

According to an embodiment, a summation of a height of the conductive member and a height of the conductive pad may be smaller than a height of the electric component.

According to an embodiment, the conductive pad may surround at least part of the periphery of the first region of the printed circuit board in which the electric component is disposed, and the conductive pad spaced apart from the electric component.

According to an embodiment, the conductive member may comprise a plurality of the conductive members surrounding the periphery of the first region of the printed circuit board by being spaced apart from each other.

According to an embodiment, the shielding member may comprise an adhesive layer (e.g., an adhesive layer 351 of FIG. 4) in contact with the conductive member and the adhesive layer including a conductive material; and a non-conductive layer (e.g., a non-conductive layer 352 of FIG. 4) disposed on the adhesive layer.

According to an embodiment, the shielding member may further include a shielding layer (e.g., shielding layer 353 of FIG. 4) interposed between the adhesive layer and the non-conductive layer, and the shielding layer electrically connected to the conductive layer through the conductive material.

According to an embodiment, the shielding member may further include a radiating layer (e.g., a radiating layer 354 of FIG. 4) interposed between the adhesive layer and the non-conductive layer.

According to an embodiment, the shielding member may further include a separating layer (e.g., separating layer 355 of FIG. 4) interposed between the adhesive layer and the electric component, and the separating layer electrically disconnecting the adhesive layer and the electric component.

According to an embodiment, the conductive pad may be disposed on periphery of one surface of the printed circuit board, and the conductive member may extend from the conductive pad to a side surface of the printed circuit board (e.g., a side surface 720*b* of the printed circuit board 720 of FIGS. 7A and 7B) along an outer surface of the printed circuit board.

According to an embodiment, the conductive member may comprise an adhesive groove (e.g., an adhesive groove 743 of FIG. 8A) disposed on a part of the conductive member in contact with the side surface of the printed circuit board, and the shielding member may cover the adhesive groove.

According to an embodiment, the conductive member may comprise an adhesive protrusion (e.g., an adhesive protrusion 744 of FIG. 8B) protruding from a part of the conductive member in contact with the side surface of the printed circuit board, and the shielding member may cover the adhesive protrusion.

According to an embodiment, an electronic device may comprise a printed circuit board including an one surface (e.g., an one surface 920*a* of a printed circuit board 920 of FIGS. 9A and 9B), a side surface (e.g., a side surface 920*b* of a printed circuit board 920 of FIGS. 9A and 9B) facing in a direction perpendicular to a direction in which the one surface faces, and a conductive layer (e.g., a conductive layer 921 of FIGS. 9A and 9B) partially exposed through the side surface, an electric component (e.g., an electric component 910 of FIGS. 9A and 9B) electrically connected to the printed circuit board and the electric component disposed on the one surface of the printed circuit board; and a shielding member (e.g., a shielding member 950 of FIGS. 9A and 9B) isolating the one surface of the printed circuit board from an outside of the printed circuit board by covering the electric component and the side surface of the printed circuit board, and the shielding member electrically connected to the conductive layer.

According to an embodiment, the electronic device may further include a conductive coating layer (e.g., a conductive coating layer of FIGS. 9A and 9B) disposed on a part of the conductive layer exposed through the side surface of the printed circuit board, and wherein the shielding member may cover the conductive coating layer.

According to an embodiment, a part of the conductive layer may be exposed through the side surface of the printed circuit board by being protrude from the side surface of the printed circuit board, and the shielding member may cover the part of the conductive layer.

According to an embodiment, the shielding member may comprise an adhesive layer (e.g., an adhesive layer 351 of FIG. 4) in contact with the side surface of the printed circuit board, and the adhesive layer including a conductive material; and a non-conductive layer (e.g., a non-conductive layer 352 of FIG. 4) disposed on the adhesive layer.

According to an embodiment, the shielding member may further include a shielding layer (e.g., a shielding layer 353 of FIG. 4) interposed between the adhesive layer and the non-conductive layer, and the shielding layer electrically connected to the conductive layer; and a radiating layer (e.g., a radiating layer 354 of FIG. 4) interposed between the adhesive layer and the shielding layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:

a printed circuit board including:

a ground layer, and a conductive pad connected to the ground layer and exposed to an outside of the printed circuit board;

an electronic component disposed on a first region of the printed circuit board and the electronic component electrically connected to the printed circuit board;

conductive members disposed on the conductive pad to be electrically connected to the conductive pad, wherein the conductive members surround at least a part of a periphery of the first region of the printed circuit board; and a shielding member electrically isolating the first region of the printed circuit board from the outside of the printed circuit board by covering the electronic component and the conductive members, the shielding member electrically connected to the ground layer through the conductive members and the conductive pad, wherein the shielding member includes:

an adhesive layer in contact with the conductive members, the adhesive layer including a conductive material, a non-conductive layer, and a radiating layer interposed between the adhesive layer and the non-conductive layer.

2. The electronic device of claim 1, further comprising another electronic component different from the electronic component, the another electronic component disposed on a second region of the printed circuit board spaced apart from the first region, wherein the shielding member isolates the first region and the second region from the outside of the printed circuit board by covering the first region and the second region, and wherein the conductive members divide the first region from the second region by being disposed between the first region and the second region.

3. The electronic device of claim 1,
wherein the conductive members extend from the conductive pad, in a direction in which one surface of the printed circuit board on which the electronic component is disposed faces.

4. The electronic device of claim 1,
wherein one end of the conductive members is in contact with the conductive pad, and
wherein the other end of the conductive members is opposite to the one end of the conductive members, and the other end of the conductive members is bent with respect to a direction in which one surface of the printed circuit board faces.

5. The electronic device of claim 1,
wherein one end of the conductive members is in contact with the conductive pad and is bent with respect to a direction in which one surface of the printed circuit board faces.

6. The electronic device of claim 1,
wherein a summation of a height of the conductive members and a height of the conductive pad is smaller than a height of the electronic component.

7. The electronic device of claim 1,
wherein the conductive pad surrounds at least part of the periphery of the first region of the printed circuit board in which the electronic component is disposed, and the conductive pad is spaced apart from the electronic component.

8. The electronic device of claim 1,
wherein the conductive members are spaced apart from each other.

9. The electronic device of claim 1,
wherein the shielding member includes
a material shrunk by heat.

10. The electronic device of claim 1,
wherein the shielding member further includes a shielding layer interposed between the adhesive layer and the non-conductive layer, the shielding layer being electrically connected to the ground layer through the conductive material.

11. The electronic device of claim 1,
wherein the adhesive layer contacts with an outer side surface of the conductive members.

12. The electronic device of claim 1,
wherein the shielding member further includes a separating layer interposed between the adhesive layer and the electronic component, the separating layer electrically disconnecting the adhesive layer and the electronic component.

13. The electronic device of claim 1,
wherein the conductive pad is disposed on periphery of one surface of the printed circuit board, and
wherein the conductive members extend from the conductive pad to a side surface of the printed circuit board along an outer surface of the printed circuit board.

14. The electronic device of claim 13,
wherein the conductive members include an adhesive groove disposed on a part of the conductive members in contact with the side surface of the printed circuit board, and
wherein the shielding member covers the adhesive groove.

15. The electronic device of claim 13,
wherein the conductive members include an adhesive protrusion protruding from a part of the conductive members in contact with the side surface of the printed circuit board, and
wherein the shielding member covers the adhesive protrusion.

16. An electronic device comprising:
a printed circuit board including:
one surface,
a side surface facing in a direction perpendicular to a direction in which the one surface faces, and
a ground layer partially exposed through the side surface;
an electronic component electrically connected to the printed circuit board and the electronic component disposed on the one surface of the printed circuit board;
a conductive coating layer disposed on a part of the ground layer exposed through the side surface of the printed circuit board; and
a shielding member isolating the one surface of the printed circuit board from an outside of the printed circuit board by covering the electronic component and the side surface of the printed circuit board, and the shielding member electrically connected to the ground layer through the conductive coating layer.

17. The electronic device of claim 16,
wherein the shielding member includes a material shrunk by heat.

18. The electronic device of claim 16,
wherein a part of the ground layer exposed through the side surface of the printed circuit board protrudes from the side surface of the printed circuit board, and
wherein the shielding member covers the part of the ground layer.

19. The electronic device of claim 16,
wherein the shielding member includes:
an adhesive layer in contact with the side surface of the printed circuit board, and the adhesive layer including a conductive material; and
a non-conductive layer disposed on the adhesive layer.

20. The electronic device of claim 19,
wherein the shielding member further includes:
a shielding layer interposed between the adhesive layer and the non-conductive layer, and the shielding layer electrically connected to the ground layer; and
a radiating layer interposed between the adhesive layer and the shielding layer.

* * * * *